United States Patent [19]
Gribkov et al.

[11] Patent Number: 5,614,162
[45] Date of Patent: Mar. 25, 1997

[54] PROCESS FOR THE PRODUCTION OF LONG FIBROUS SILICON CARBIDE WHISKERS

[75] Inventors: Vladimir N. Gribkov; Alexandre Polakov; Daniel D. Pokrovcky, all of Moscow; Vladmir A. Silaev, Tverskaja obl.; Yurii A. Golerov, Tverskaja obl; Piotr P. Lyacota, Tverskaja obl., all of Russian Federation

[73] Assignees: Societe Nationale Industrielle et Aerospatiale, Paris, France; VIAM - All Russian Institut of Aviation Materials, Moscow, Russian Federation

[21] Appl. No.: 390,505

[22] Filed: Feb. 17, 1995

[30] Foreign Application Priority Data

Feb. 17, 1994 [FR] France .................................. 94 01826

[51] Int. Cl.⁶ .................................................. C01B 31/36
[52] U.S. Cl. .......................... 423/346; 423/345; 427/227; 427/255.2
[58] Field of Search ...................... 423/345, 346; 427/227, 322, 324, 255.1, 255.2

[56] References Cited

U.S. PATENT DOCUMENTS

| | | |
|---|---|---|
| 3,622,272 | 11/1971 | Shyne et al. . |
| 4,284,612 | 8/1981 | Horne, Jr. et al. ...................... 423/345 |
| 4,504,453 | 3/1985 | Tanaka et al. . |
| 4,789,536 | 12/1988 | Schramm et al. . |
| 4,789,537 | 12/1988 | Shalek et al. ............................ 423/346 |
| 4,849,196 | 7/1989 | Yamada et al. .......................... 423/346 |
| 5,404,836 | 4/1995 | Milewski ................................. 423/346 |

FOREIGN PATENT DOCUMENTS

| | | | |
|---|---|---|---|
| 1563415 | 4/1969 | France . | |
| 508475 | 3/1976 | Russian Federation ................ 423/346 |
| 1232617 | 5/1971 | United Kingdom .................... 423/346 |

*Primary Examiner*—Wayne Langel
*Attorney, Agent, or Firm*—Burns, Doane, Swecker & Mathis, L.L.P.

[57] ABSTRACT

The production of SiC whiskers and of mats thereof on a substrate by treatment, at 1250° to 1500° C., of a gaseous mixture including hydrogen and sources of Si and C atoms which are in the form of at least one oxygen-free compound, in the presence of a metal type catalyst, by a semi-continuous or periodic process, is characterized in that, during the growth period, an Al-Fe catalyst is introduced into the gas phase in the reaction zone, by means of carbon reduction of aluminosilicate ceramics, which comprise at least 73 weight % of $Al_2O_3$ and 0.3 to 3.0 weight % of iron oxides and the substrate is a carbonized rayon fiber based carbon fabric which has been pre-treated, prior to carbonization, with a solution of borax and a solution of diammonium phosphate until the quantities of boron and phosphorus in the fabric do not amount to more than 4 and 2 weight %, respectively.

7 Claims, 1 Drawing Sheet

$SiCl_4 + CH_4 + H_2$

PROCESS FOR THE PRODUCTION OF LONG FIBROUS SILICON CARBIDE WHISKERS

FIELD OF THE INVENTION

The invention relates to a process for the production of silicon carbide (SIC) whiskers and, more especially, of whiskers in the form of long fibers, which can be used as reinforcing materials by incorporation into metal based composites, engineering ceramics, ceramic cutting tools, thermal insulation materials, etc.

BACKGROUND OF THE INVENTION

The most widely used technology at present for producing SiC whiskers is chemical vapor deposition (CVD). This process is often implemented using solid or gaseous starting reactants and employing overall chemical reactions such as:

$$SiO_2 + 3C \rightarrow SiC + 2CO \text{ or}$$

$$SiCl_4 + H_2 + CH_4 \rightarrow SiC + H_2 + 4HCl.$$

As a general rule, to grow SiC whiskers, that is to say fine, elongated monocrystals, the process is carried out in the presence of elements that are called catalysts or solvents. As catalysts, use is often made of the transition metals Fe, Ni, Cr or Mn, but other elements such as Al, La, etc. can also be used. These elements can be introduced specially into the reaction zone or they may be present, as impurities, in the starting components or reactants. It is also possible to introduce the solvent elements concerned in the form of various compounds, for example oxides, if there exist conditions, in the whisker production process, that ensure that the compound in question is transformed into a free element.

The essential part played by the solvent or catalyst element is to form solutions, under SiC whisker production conditions, in the form of melted masses containing silicium and carbon, of the Me—Si—C type, with Me representing the metal or the metals playing the part-of the solvent or catalyst. In such a case, chemical vapor deposition takes place primarily on the surface of the droplets of melted mass according to the so-called VLS (Vapour-Liquid-Solid) process, which ensures the unidirectional axial growth of the SiC in the form of whiskers from the gaseous phase.

What is peculiar to all processes for the production of whiskers, including SiC whiskers, is that they have to be conducted at low supersaturation levels that are characteristic of one-dimensional growth. If, on the contrary, low supersaturation levels are not used, isometric equiaxial crystals, polycrystalline films or even powdery precipitates are formed instead of whiskers. Consequently, it is required for the process to be conducted with a gaseous phase containing a low concentration of reactants. The result of this requirement is an extremely low yield. For instance, in the case of SiC whiskers, the yield is generally from 0.1 to 1.0 g/m² .h and, in exceptional cases, it reaches 3 to 5 g/m² .h.

To overcome this drawback in industrial-scale production of SiC whiskers, they are grown within porous bodies forming substrates and having a high specific area.

In such cases, as a rule, the following reaction is used:

$$SiO_2 + 3C \rightarrow SiC + 2CO.$$

It is also possible, however, to "purge" the porous substrate with a gaseous mixture of the $SiCl_4 + H_2 + CH_4$ type.

As a substrate material, use is made, in these two cases, of silica ($SiO_2$) and of carbon disaggregated using different methods, or natural or synthetic substances containing silica and carbon. The solvent elements are either present at the outset in the starting components of the substrate, or they are specially introduced into the substrate.

The use of a highly porous substrate, as described above, makes it possible to achieve economically acceptable productivity with industrial plants, but the length of the SiC whiskers is limited by the dimensions of the pores in the substrate.

In general, the length of the SiC whiskers manufactured industrially amounts to a few tens of microns and not more than a hundred of microns.

There is known a process that enables the substrate to be disaggregated by introducing thereinto a polymer, carbon or ceramic fibers forming a skeleton, in order to form larger pores but, even then, the maximum length of the whiskers does not exceed 1 mm.

In view of the above, there is perceived to be a great need for SiC whiskers with lengths ranging from several millimeters to tens, or even hundreds, of millimeters, for different applications in the subsequent manufacture of continuous filaments, fabrics, mats, sheets and non-woven, semi-finished products.

To produce whiskers of such great length, it is necessary to provide free space having the requisite dimensions and, consequently, porous substrates become unacceptable. Use is then usually made of massive graphite and, less frequently, ceramic substrates. The whiskers are grown only at the geometrical substrate-gas interface. The chemical reactions used then are of the first or the second type indicated above. A solvent element is either deposited directly on the surface of the substrate, or placed separately in the vicinity thereof. With the processes that have just been described, it is possible to grow SiC whiskers having lengths of as much as 20 to 30 mm, or even more, but the productivity of the most efficient and widely used processes does not exceed 5 g/m² .h. According to present evaluations, such processes can only become economically acceptable if productivity is increased by at least a factor of 2.

The need to use a massive substrate, that is to say one that is sufficiently thick in the case of graphite or ceramics, is an obstacle to the creation of large-scale industrial plants, and it will be appreciated that, in order to obtain sufficiently uniform products, it is necessary to ensure process parameters that are as constant as possible, in particular an equal concentration of reactants throughout the volume of the apparatus.

Separation of the whiskers from the substrate is the essential problem, as they are closely bonded thereto. The process described above is extremely difficult to mechanize and leads to contamination of the resulting product by the material of the substrate.

SUMMARY OF THE INVENTION

Consequently, the objects of the invention are:
- to increase the productivity of the process for preparing long (5 to 100 mm) fibrous SiC whiskers to levels that render this process economically acceptable;
- to develop a technology that can be applied to large-scale industrial plants;
- to ensure the stability of the composition with regard to concentration and other parameters of whisker growth throughout the volume of a large apparatus and for the time necessary for the production of long SiC whiskers;

to enable the whiskers formed to be separated easily from the substrate without being damaged and without the resultant product being contaminated by the material of the substrate.

These objects are achieved according to the invention, which provides a process for the production of SiC whiskers and mats thereof on a substrate by heat treatment, at a temperature of 1250° to 1500° C., of a gaseous mixture including hydrogen and sources of Si and C atoms that are in the form of at least one oxygen-free compound, in the presence of a catalyst chosen from the group of metals, by a semi-continuous or periodic process, which process is characterized in that:

during the growth period, a two-component catalyst, Al-Fe, is introduced into the gaseous phase in the reaction zone by means of a carbon reduction of aluminosilicate ceramics, which ceramics comprise at least 73 weight % of $Al_2O_3$ and 0.3 to 3.0 weight % of iron oxides; and the substrate is a carbonized rayon fiber based carbon fabric, which fabric has been pre-treated, prior to carbonization, with a solution of borax and a solution of diammonium phosphate until the quantity of boron in the fabric does not amount to more than 4 weight % and the quantity of phosphorus does not amount to more than 2 weight %.

According to a first advantageous form of embodiment, the process according to the invention is characterized in that it is a semi-continuous process, implemented by transporting SiC whisker growing assemblies through the reaction zone, which assemblies comprise open-ended graphite boxes in which there are stacked in parallel, one above the other, graphite trays with charges of aluminosilicate ceramics and carbon and in which there are disposed, alternating between the trays, substrates made of carbon fabric.

It is desirable for the initial gaseous reactants to be introduced in the form of a "purge" in the direction opposite to that of the movement of the SiC whisker growing assemblies, through the reaction zone.

According to a second advantageous form of embodiment, the process according to the invention is characterized in that it is a periodic process, implemented in a vertical shaft furnace in which, in the planes perpendicular to the direction of the gas flow, there are distributed carbon fabric substrates which are separated by a distance of 50 to 300 mm and each have a central hole through which the initial gaseous mixture is introduced, and in which the aluminosilicate ceramic charge is placed along the outer perimeter of the substrates.

As a source of free silicon, it is appropriate to use compounds of the following types: $SiCl_4$, $SiHCl_3$, $CH_3SiCl_3$ and other similar oxygen-free compounds.

The choice of such a compound depends, in particular, on the type of process (semi-continuous or periodic), and on the type and the dimensions of the reaction zone. When the reaction zone is of great length and the gaseous mixture flows through the reaction zone for a long time, it is preferable to use less reactive $SiCl_4$ under temperature conditions that are high and close to 1500° C., but, when the reaction zone is short, it is preferable to use $CH_3SiCl_3$ or $SiHCl_3$ at temperatures close to 1300° C.

As a source of free carbon, use is advantageously made of a hydrocarbon, preferably methane.

The normal composition in terms of concentration of the mixture is as follows: 0.5 to 2.5 volume % of $SiCl_4$; hydrocarbon in an amount that satisfies the atomic ratio C:Si=1 to 2; with hydrogen forming the balance.

Al and Fe are used simultaneously as catalysts. In such a combination, Al, which has high catalytic activity with respect to reactions on the surface of the droplets, ensures fast axial growth and Fe, which is a good solvent for carbon, minimizes the defects and provides the whiskers with high mechanical strength.

In order to have continuous, uniform introduction of Al and Fe into the reaction zone over a long time period, aluminosilicate ceramics of the above-indicated composition are placed in contact with carbon in a graphite assembly or in a charge containing carbon powder. The degree of grinding of the ceramics and the amount of carbon possibly introduced, are adjusted according to the requisite temperature and the starting component composition.

When ceramics containing less than 73 weight % of $Al_2O_3$ are used, the product is contaminated by $SiO_2$ due to the more active reduction of free silica by carbon.

A drop in the iron oxide content of the ceramics to a value of less than 0.3 weight % leads to unstable growth with the formation of short, defective and significantly less strong whiskers.

An increase of the iron oxide content to a value of more than 3.0 weight % leads to the whiskers being of larger diameter and to their contamination by the iron silicides as impurities.

According to the present invention, a carbonized rayon fiber based carbon fabric is used as a substrate, which fabric is treated, prior to carbonization, with solutions of borax and diammonium phosphate. This fabric contains up to 2 weight % of phosphorus and up to 4 weight % of boron. Consequently, a surface modification of the carbon fibers takes place, which modification prevents the formation of a strong "whisker—carbon fiber" bond and, owing to this, the resulting whiskers that develop in the form of mats on the surface of the substrate are easily removed without damage or contamination.

The process according to the invention is implemented in assemblies comprising furnaces operating semi-continuously or periodically, in a hydrogen atmosphere.

DETAILED DESCRIPTION OF THE INVENTION

Figure 1:
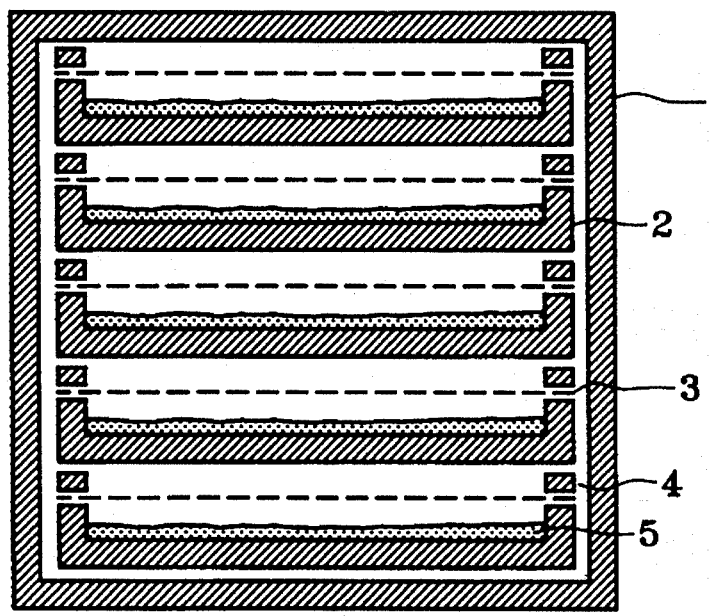
FIG. 1 illustrates the semi-continuous process.

FIG. 1 is a drawing which represents, in cross-section, an assembly for growing SiC whiskers, comprising an open-ended graphite box 1 with a rectangular cross-section, in which there are several graphite trays 2, alternating with substrates 3, constituted by layers of carbon fabric, and graphite inserts 4. The charge 5, comprising a mixture of mullite and carbon, is placed in the trays.

The carbon fabric is disposed in such a way that the distance between the surface of charge 5 and the said fabric 3, as well as the distance between the lower portion of tray which is above the said fabric and the said fabric 3 are in a range of 10 to 50 mm. These distances are defined by the height of the side wall of the tray 2 and by the thickness of insert 4.

In the semi-continuous process, assemblies for growing SiC whiskers of the above-described construction are pushed periodically, one after the other, through the heated zone in the furnace, with the help of sluice chambers and appropriate drive mechanisms.

The initial gaseous mixture is introduced through the heating zone in the direction opposite that of the movement of growing assemblies. After passing through the furnace, the growing assemblies are unloaded through the outlet sluice chamber and the whiskers formed are removed. The whiskers grow mainly on the two faces of the carbon fabric substrate and can easily be removed therefrom as homogeneous mats, without any contamination or damage. The length of the whiskers reaches 20 to 30 mm when their diameter is in the range of 0.8 to 2.5 μm. The mechanical strength of the whiskers is greater than $1.10^4$ MPa.

According to the invention, in the semi-continuous process, the SiC whiskers can also grow in the form of primarily orientated mats with unidirectional orientation of 60 to 80% of the whiskers. For this purpose, the process is implemented as explained above, but provided that the linear velocity of the initial gaseous reactants over the surface of the substrate be at least 0.2 cm/s under normal conditions. The quality of the final product is as indicated hereabove.

This process ensures long fibrous SiC whisker productivity of 10 to 15 g/m² h, which is 2 to 3 times higher than that obtained with the most productive or efficient known processes.

Figure 2:
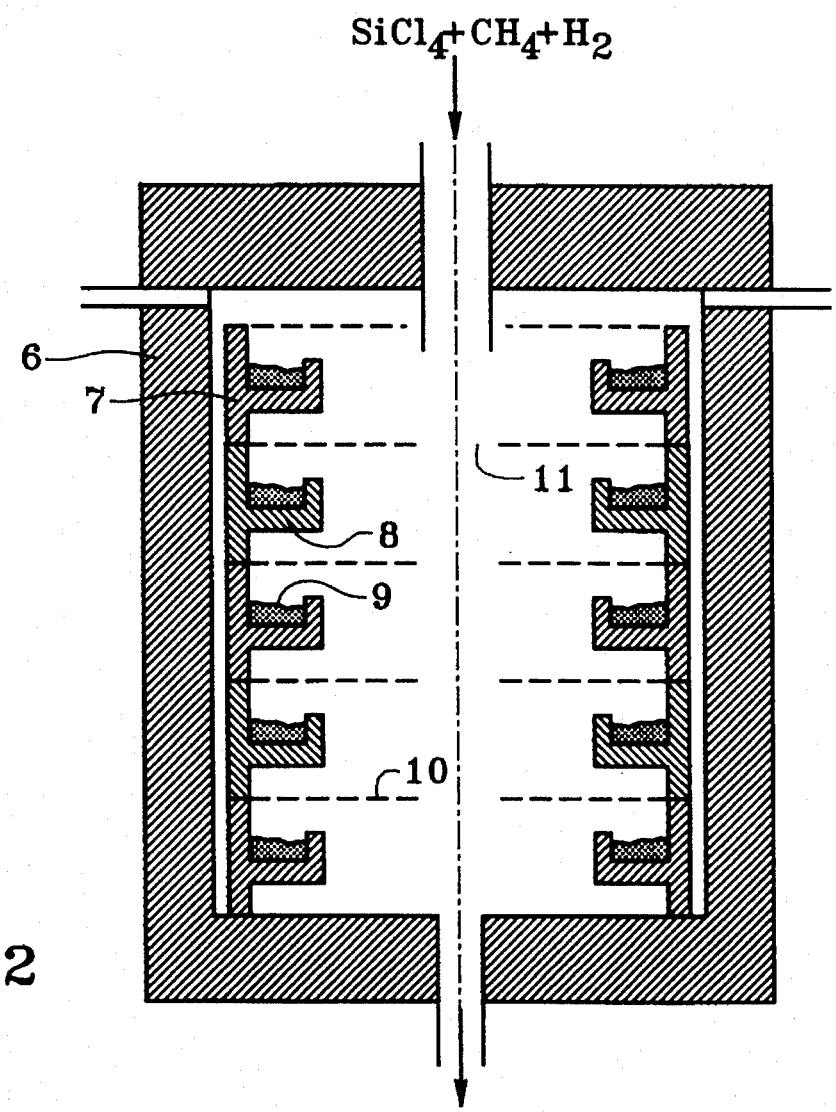
FIG. 2 illustrates the periodic process.

FIG. 2 is a drawing relating to the periodic process. It shows in cross-section a shaft surface 6 with a hydrogen atmosphere, inside which is an assembly for growing SiC whiskers, comprising graphite rings 7 having trays 8 on which is placed the catalyst source charge 9, and this assembly further comprises substrates 10 of carbon fabric each having a central hole 11 to allow through the gases.

In prolonged use of the periodic process, charge 9 must not contain carbon as the contact between the aluminosilicate ceramics and the walls of the graphite trays meet the required conditions.

When the periodic process is implemented, the initial gaseous mixture is introduced into the assembly through the central inlet in the upper portion of the furnace and the off-gases are removed via the union at the base of the furnace. The process is conducted at a temperature of 1250° to 1500° C. for 10 to 20 hours. The whiskers develop essentially on the carbon fabric substrates 10 and reach a length of 100 mm or more, until the opposite growth fronts, from the adjacent substrates, join together. The resulting bulky, dense annular mats are easily removed from the substrates when the rings are disassembled. The mean mechanical strength of the SiC whiskers thus obtained is from $0.8 \cdot 10^4$ to $1.5 \cdot 10^4$ MPa when their diameter is from 1 to 2 μm, and the mean diameter of the whiskers is from 0.5 to 1.5 μm.

The following examples are intended to illustrate and clarify the invention.

EXAMPLE 1

In open-ended graphite boxes having the outside dimensions of 300×300×300 mm were placed, as shown in FIG. 1, three graphite trays. Between these trays three layers of carbon fabric were fixed using graphite inserts.

The boxes, trays and inserts were made of commercial grade graphite. The carbon fabric substrates having the requisite dimensions were cut out from a carbon fabric made from carbonized rayon fiber that had been pre-treated prior to carbonization with borax and diammonium phosphate solutions. The fabric contained 2.5 weight % of boron and 1.8 weight % of phosphorus.

First of all, the graphite trays were filled with a milled mixture (mean particle size: 0.5 mm) of refractory aluminosilicate and 5 weight % of carbon black; the thickness of the resulting layer was from 8 to 10 mm. The composition by weight of the refractory aluminosilicate was as follows: 75% of $Al_2O_3$; 1.4% of $(FeO+F_2O_3)$, the balance being $SiO_2$. The phase was composed of mullite and $\alpha Al_2O_3$.

The height of the graphite insert was predetermined in such a way that the distance between the carbon fabric and the layer of ceramic charge, as well as between the fabric and the lower portion of the tray that was located above was 25 mm.

When the assemblies for growing the whiskers were ready, they were loaded into a semi-continuously operating tunnel furnace, via an evacuated sluice chamber and they were pushed one after another at the rate of 1 assembly per hour.

The furnace in question had a rectangular duct cross-section with dimensions of 350×350 mm and a length of zone, at a uniform temperature, of 500 to 600 mm. The heaters and the walls of the furnace were made of commercial grade graphite. The temperature in the furnace was maintained at 1350±25° C.

The initial gaseous mixture comprising 1.2 volume % of $CH_3SiCl_3$, the balance being formed by hydrogen, was introduced at a rate of 2.5 m³/hr in the direction opposite to that of the movement of the whisker growing assemblies. The waste gases were purified from gaseous reaction products in an absorber and then neutralized to remove HCl and, finally, the hydrogen was burned.

Under the conditions described above, each growing assembly remained for 2 hours in the furnace zone, which had a maximum temperature of 1350° C.

After passing through the active or working zone and cooling during the following passage through a cooling chamber, all the growing assemblies were removed from the furnace using an evacuated outlet sluice chamber, and then the whiskers formed and the unreacted charge were removed from the assemblies.

The quantity of whiskers formed on the carbon fabric substrates was equal to 5.5 g, with an additional 1.5 to 2.0 g on the walls of the box and trays.

On the carbon fabric substrates, the whiskers grew in the form of two-sided mats of uniform thickness and density. In these mats, 60 to 70% of the whiskers were unidirectionally orientated, in the same direction as that of the gas flow. All the mats were easy to remove from the substrates. The mean diameter of the whiskers in the mats was 1.0 μm, with the diameters ranging from 0.5 to 3.0 μm. The maximum length of the whiskers was 30 mm and their mean length was 5 to 6 mm. The mechanical strength was determined to be at least $1.2 \cdot 10^4$ MPa.

EXAMPLE 2

An SiC whisker growing assembly as represented in FIG. 2 was placed in a shaft furnace equipped with graphite side walls and heaters. This assembly comprised 16 graphite rings. The outside diameter of a ring was 700 mm and its height was 100 mm. This assembly also included 15 annular substrates of carbon fabric each having a central hole with a diameter of 200 mm. These substrates were cut out of a carbon fabric having the same composition as in Example 1.

A charge comprising refractory granular aluminosilicate having the same composition as in Example 1 was placed on the trays of the assembly. The particle size of the aluminosilicate was 3 to 5 mm.

The furnace, into which the assembly with this charge was inserted, was purged with nitrogen until all the air had been removed. The furnace was then heated to 1430° C. in a hydrogen atmosphere, after which a gaseous mixture comprising 2.0 volume % of $SiCl_4$ and 2.5 volume % of methane, with hydrogen forming the balance, was introduced via the central inlet at a rate of 8 $m^3$/hr. The waste gases were removed through the bottom part of the furnace, after which they were purified in an absorber and neutralized; then the hydrogen was burned. The process was conducted for 16 hours. When the process was completed, the introduction of the gaseous mixture was halted and the furnace was cooled in a nitrogen atmosphere. The whisker growing assembly was removed from the furnace and disassembled after complete cooling.

Bulky annular mats, comprising SiC whiskers of up to 50 mm long were easily removed from the spaces between the adjacent substrates. The total amount of whiskers was equal to 1.0 to 1.1 kg. The mean diameter of the whiskers was from 0.5 to 1.5 μm, and their mechanical strength was at least 8000 MPa.

We claim:

1. A process for the production of SiC whiskers and of mats thereof on a substrate in a reaction zone having a gas phase by heat treatment, at a temperature of 1250° to 1500° C., of a gaseous mixture comprising hydrogen and sources of Si and C atoms which are in the form of at least one oxygen-free compound, in the presence of a catalyst, by a semi-continuous or periodic process, wherein:

a catalyst comprising Al and Fe is introduced into the gas phase in the reaction zone during a growth period of SiC whiskers or of mats thereof with a carbon reduction of aluminosilicate ceramics, said ceramics comprising at least 73 weight % of $Al_2O_3$ and 0.3 to 3.0 weight % of iron oxides; and the substrate is a carbonized rayon fiber based carbon fabric which has undergone, prior to carbonization, a surface modification with a solution of borax and a solution of diammonium phosphate until the quantity of boron in the fabric is less than or equal to 4 weight % and the quantity of phosphorus is less than or equal to 2 weight %.

2. A process according to claim 1, which is a semi-continuous process, conducted by transporting, through the reaction zone, SiC whisker growing assemblies, which assemblies comprise open-ended graphite boxes in which are stacked in parallel, one above the other, graphite trays with charges of aluminosilicate ceramics and carbon and in which there are disposed, alternating between the trays, substrates made of carbon fabric.

3. The process according to claim 2, wherein the distance between the surface of the charge and the substrate, as well as the distance between the lower portion of the tray which is above the said substrate and the said substrate are in the range of 10 to 50 mm.

4. The process according to claim 2, wherein the initial gaseous reactants are introduced in the form of a "purge" in the direction opposite to that of the movement of the SiC whisker growing assemblies, through the reaction zone.

5. The process according to claim 2, wherein in order to produce mats of SiC whiskers with primarily unidirectional orientation, the linear velocity of the initial gaseous reactants over the surface of the substrate is adjusted to at least 0.2 cm/s.

6. A process according to claim 1, which is a periodic process, implemented in a vertical shaft furnace in which, in the planes perpendicular to the direction of the gas flow, there are distributed substrates of carbon fabric which are separated by a distance of 50 to 300 mm and each have a central hole through which the initial gas mixture is introduced, and in which the charge of aluminosilicate ceramics is placed along the outer perimeter of the substrates.

7. A process according to claim 5, wherein up to 80% of the SiC whiskers in said mats have a unidirectional orientation.

* * * * *

UNITED STATES PATENT AND TRADEMARK OFFICE
CERTIFICATE OF CORRECTION

PATENT NO. : 5,614.162

DATED : March 25, 1997

INVENTOR(S) : Vladimir N. GRIBKOV et al.

It is certified that error appears in the above-identified patent and that said Letters Patent is hereby corrected as shown below:

On the Title Page:

[73] Assignees: please delete "Societe Nationale Industrielle et Aerospatiale" and insert therefor --Aerospatiale Societe Nationale Industrielle--;

Column 1, line 41, please delete "part-of" and insert therefor --part of--;

Column 4, line 59, after "tray" please insert --2--; and

Column 6, line 62, please delete "16" and insert therefor --16--.

Signed and Sealed this

Third Day of June, 1997

Attest:

BRUCE LEHMAN

Attesting Officer

Commissioner of Patents and Trademarks